(12) United States Patent
Kneissl et al.

(10) Patent No.: US 6,597,717 B1
(45) Date of Patent: Jul. 22, 2003

(54) STRUCTURE AND METHOD FOR INDEX-GUIDED, INNER STRIPE LASER DIODE STRUCTURE

(75) Inventors: Michael A. Kneissl, Mountain View, CA (US); David P. Bour, Cupertino, CA (US); Linda T. Romano, Sunnyvale, CA (US); Brent S. Krusor, Fremont, CA (US); Noble M. Johnson, Menlo Park, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/443,172

(22) Filed: Nov. 19, 1999

(51) Int. Cl.$^7$ ................................................ H01S 5/00
(52) U.S. Cl. ............................. 372/46; 372/45; 438/22
(58) Field of Search ......................... 372/46, 45; 438/22

(56) References Cited

FOREIGN PATENT DOCUMENTS

| EP | 0788203 A1 | * | 8/1997 | ............ H01S/3/18 |
|---|---|---|---|---|
| JP | 60-116188 | | 6/1985 | |
| JP | 08-097502 A | * | 4/1996 | ............ H01S/3/18 |
| JP | 10-027947 A | * | 1/1998 | ............ H01S/3/18 |
| JP | 10-093200 A | * | 4/1998 | ............ H01S/3/18 |
| JP | 10-154851 A | * | 6/1998 | ............ H01S/3/18 |
| JP | 11-284282 | | 10/1999 | |
| JP | 2000-58969 | | 2/2000 | |

* cited by examiner

*Primary Examiner*—Quyen Leung
(74) *Attorney, Agent, or Firm*—Bever, Hoffman & Harms, LLP; Patrick T. Bever

(57) ABSTRACT

An inner stripe laser diode structure for GaN laser diodes is disclosed. Inner stripe laser diode structures provide a convenient means of achieving low threshold, single mode laser diodes. The structure of an inner stripe laser diode is modified to produce lateral index guiding.

11 Claims, 15 Drawing Sheets

STRUCTURE AND METHOD FOR INDEX-GUIDED, INNER STRIPE LASER DIODE STRUCTURE

FIELD OF INVENTION

The invention relates to index guided, inner stripe laser diode structures.

BACKGROUND OF INVENTION

Inner stripe laser diode structures have been commonly used in both red AlGaInP and infrared AlGaAs laser diodes. Inner stripe laser diode structures provide a convenient means of achieving low threshold, single mode laser diodes. An inner stripe laser diode structure requires two epitaxial growth steps. The first epitaxial growth step typically involves growth of the lower cladding layer, the active region, a portion of the upper cladding layer and an n-type blocking layer. Following the etching away of the n-blocking layer in a narrow stripe, the remaining portion of the n-cladding layer is grown. In operation, the injection current path is defined by the etched stripe opening in the n-blocking layer, even though the p-metal contact pad may be significantly wider than the stripe.

The current-blocking layer is placed close to the active region, typically being at about a 100–200 nm separation from the boundary of the active region into the upper-cladding layer. Due to the relative ease of creating a 1–2 $\mu$m wide stripe in the n-blocking layer, very low threshold current lasers can be fabricated. It is much easier to form a 2 $\mu$m wide stripe in this self-aligned structure in comparison with, for example, the similarly narrow ridge waveguide laser because a ridge waveguide structure requires that a narrow contact stripe, typically 1–1.5 $\mu$m, be carefully aligned on the top of the ridge structure. Very narrow inner stripe laser diodes offer improved heat dissipation because lateral heat spreading is enhanced as the width of the laser stripe is reduced. Hence, when a new semiconductor laser material system is developed, the inner stripe structure is often the first structure used to achieve a single mode laser.

Although the inner stripe laser diode structure is advantageous to achieving low threshold, single mode operation, the resulting beam quality is relatively poor and unsuitable for many important applications. The beam quality is relatively poor because no lateral positive index guiding is provided by the inner stripe laser diode structure. Instead, a highly astigmatic beam is generated because the inner laser stripe structure is gain-guided. While astigmatism is correctable using cylindrical optics, the lateral beam divergence and astigmatism may vary with drive current.

Nitride inner stripe laser diodes with a current blocking layer are disclosed in U.S. Pat. No. 5,974,069 by Tanaka et al. Tanaka et al. disclose current blocking layers made from materials including those selected from a group consisting of $Al_yGa_{1-x}N$ (0<y=1), $SiO_2$, $Si_3N_4$ and $Al_2O_3$.

FIG. 1a shows the lateral index step as a function of the thickness of first upper cladding layer 5 for two cladding layer laser diode structure 11 shown in FIG. 1b which is similar to that of Tanaka et al. Note that Tanaka et al. disclose a first upper cladding layer with a thickness of at least 100 nm which limits the lateral index, An, to no greater than $4 \times 10^{-3}$. FIG. 1b shows active region 4 beneath first upper cladding layer 5 which supports current blocking layer 6 covered by second upper cladding layer 7. Curve 50 shows that as the thickness of first upper cladding layer 5 increases for two cladding layer structure 11, the lateral index step (and the resulting optical confinement) drops from an initial lateral index step of about $11 \times 10^{-3}$ at zero thickness.

SUMMARY OF THE INVENTION

The structure of an inner stripe laser may be modified to produce lateral index guiding and provide the beam quality necessary for printing and optical storage. The modified inner stripe laser structure allows for excellent beam quality and modal discrimination while retaining the benefits of the basic inner stripe laser structure. The modified inner stripe structure is applicable to nitride laser diode structures and other material systems which are relatively insensitive to regrowth interfaces close to the active region. In AlGaAs and AlGaInP laser systems, for example, the defect states associated with a regrowth interface close to the active region are sufficient to inhibit lasing.

The modified inner stripe laser structure involves an epitaxial growth of a conventional inner stripe laser structure including a partial upper waveguide layer. A current blocking layer is then grown on the partial upper waveguide layer with a narrow stripe subsequently opened in the blocking layer. Following definition of the narrow stripe, an epitaxial regrowth is performed to complete the upper waveguide layer along with the cladding and contact layers. Finally, the structure is processed in the standard manner, including contact metallization and mirror formation.

Because regrowth for the modified inner stripe laser structure starts with the upper waveguide layer instead of proceeding directly to regrowth of the upper cladding layer, a positive lateral index guide may be created. By starting regrowth with the upper waveguide, the thickness of the waveguide in the narrow stripe region is made greater than the thickness of the wing regions of the waveguide. The wing regions of the upper waveguide are the waveguide regions beneath the blocking layer next to the active region. The difference in thickness functions to produce a lateral index step. The strength of the lateral index waveguiding depends in part on how close the blocking layer is placed to the active region with closer placement providing better lateral index guiding. The current blocking layer may be n-type or insulating material and materials that may be used for the current blocking layer include AlGaN, AlN, $SiO_2$, SiON and $Si_3N_4$. Typical values of the lateral index step obtained in accordance with the invention are about $20 \times 10^{-3}$.

The advantages and objects of the present invention will become apparent to those skilled in the art from the following detailed description of the invention, its preferred embodiments, the accompanying drawings, and the appended claims.

BRIEF DESCRIPTION OF THE DRAWINGS

FIGS. 2–4a show steps in the fabrication procedure for an index-guided inner stripe nitride laser diode structure in accordance with the invention.

DETAILED DESCRIPTION

An index-guided inner stripe laser diode structure is realizable if the regrowth interface can be placed close to the active region which is possible if the regrowth interface is relatively benign. In general, the regrowth interface is often structurally defective or chemically contaminated. However, material systems such as nitrides that may be used for laser diodes are relatively insensitive to regrowth interfaces near the active region and this insensitivity allows epitaxial regrowth to be performed within a waveguide of the laser diode structure. Regrowth allows the incorporation of a current blocking layer which has a low refractive index (typically less than n~2.5) to enhance optical confinement.

The current blocking layer material is selected to be thermally stable to avoid decomposition in a metalorganic chemical vapor deposition (MOCVD) environment which typically has temperatures in excess of 900° C. and a reactive ambient. The current blocking layer may be insulating or semiconductor material, in the latter case a current blocking reverse bias junction is created to confine current flow to the active region by doping the current blocking layer. Semiconductor current blocking layers have a relatively high refractive index which limits the index step available for optical confinement. Advantages of semiconductor current blocking layers include thermal stability and straightforward regrowth. Conformal growth results in uniform surface coating whereas selective growth results in crystal nucleation only in select areas. Regrowth of semiconductor material performed at a temperature of about 900° C. is Conformal; but for GaN growth no deposition occurs on $Si_3N_4$, $SiO_2$ or similar insulating material, i.e., the growth is selective. However, for AlGaN growth, polycrystalline material with rough surfaces is deposited on $Si_3N_4$, $SiO_2$ or similar insulating material.

Figure 1A:
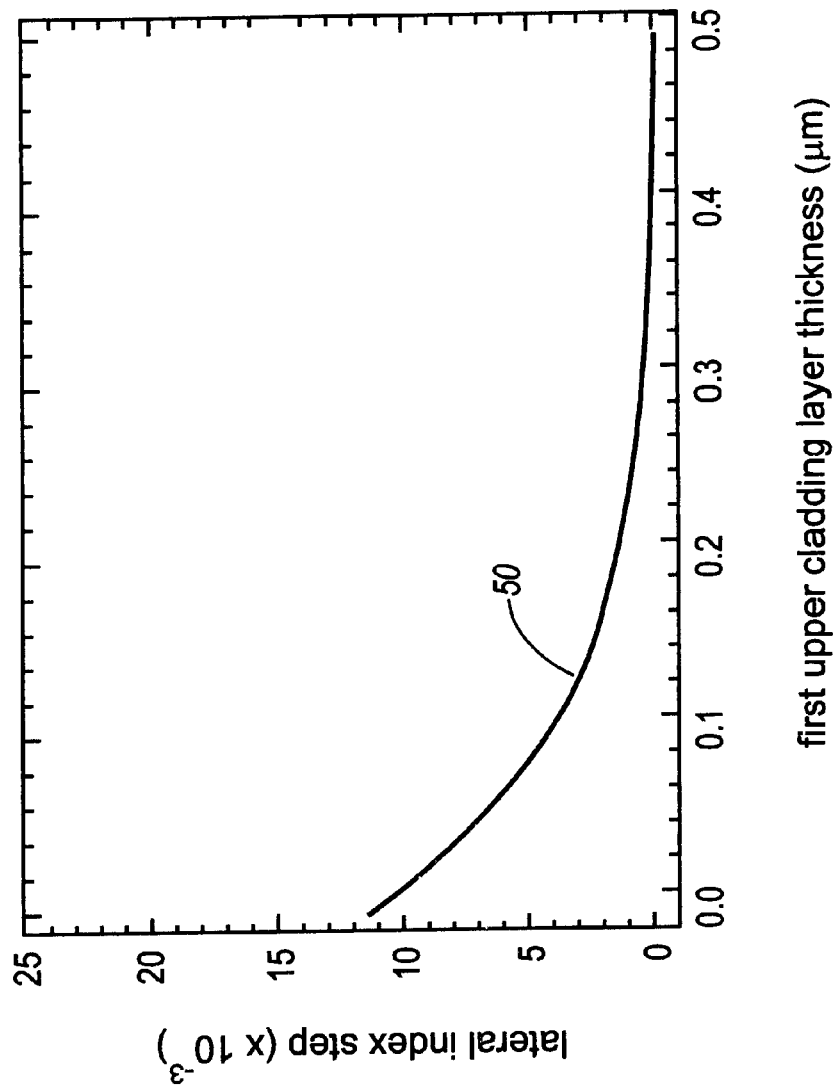
FIG. 1a shows the lateral index step as a function of first upper cladding layer thickness in the prior art.
Figure 1B:
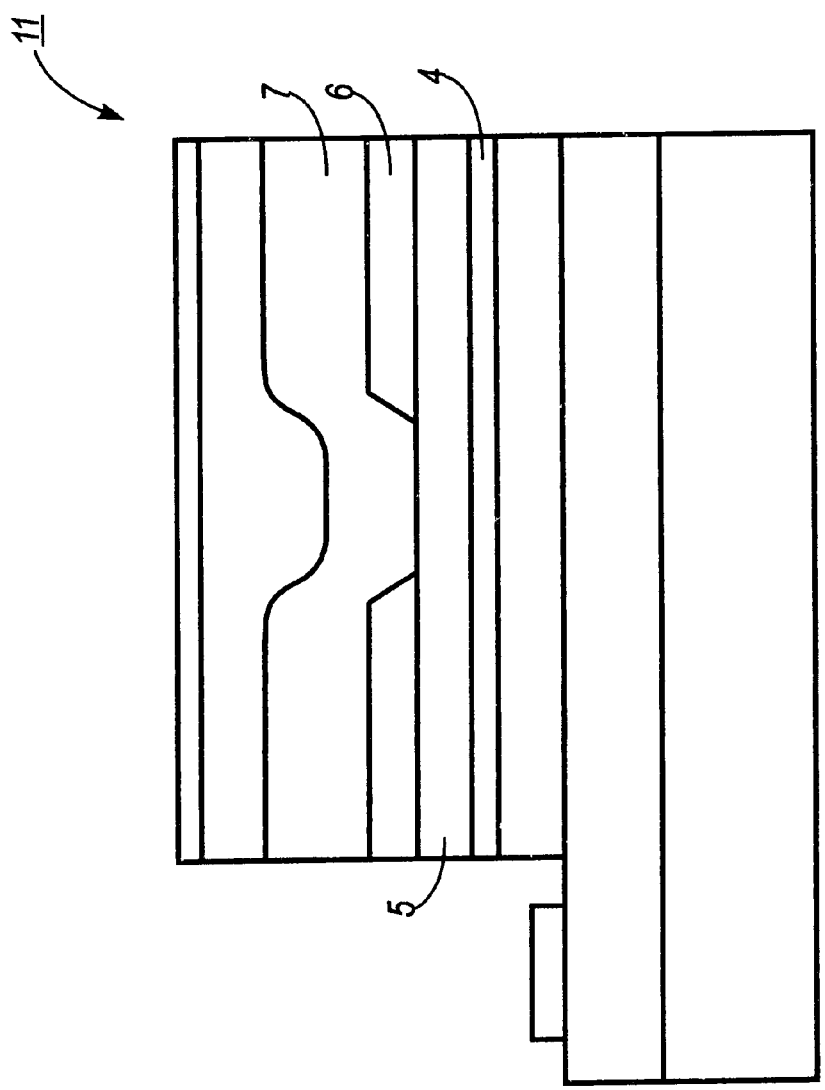
FIG. 1b shows a laser diode structure in the prior art.
Figure 2:
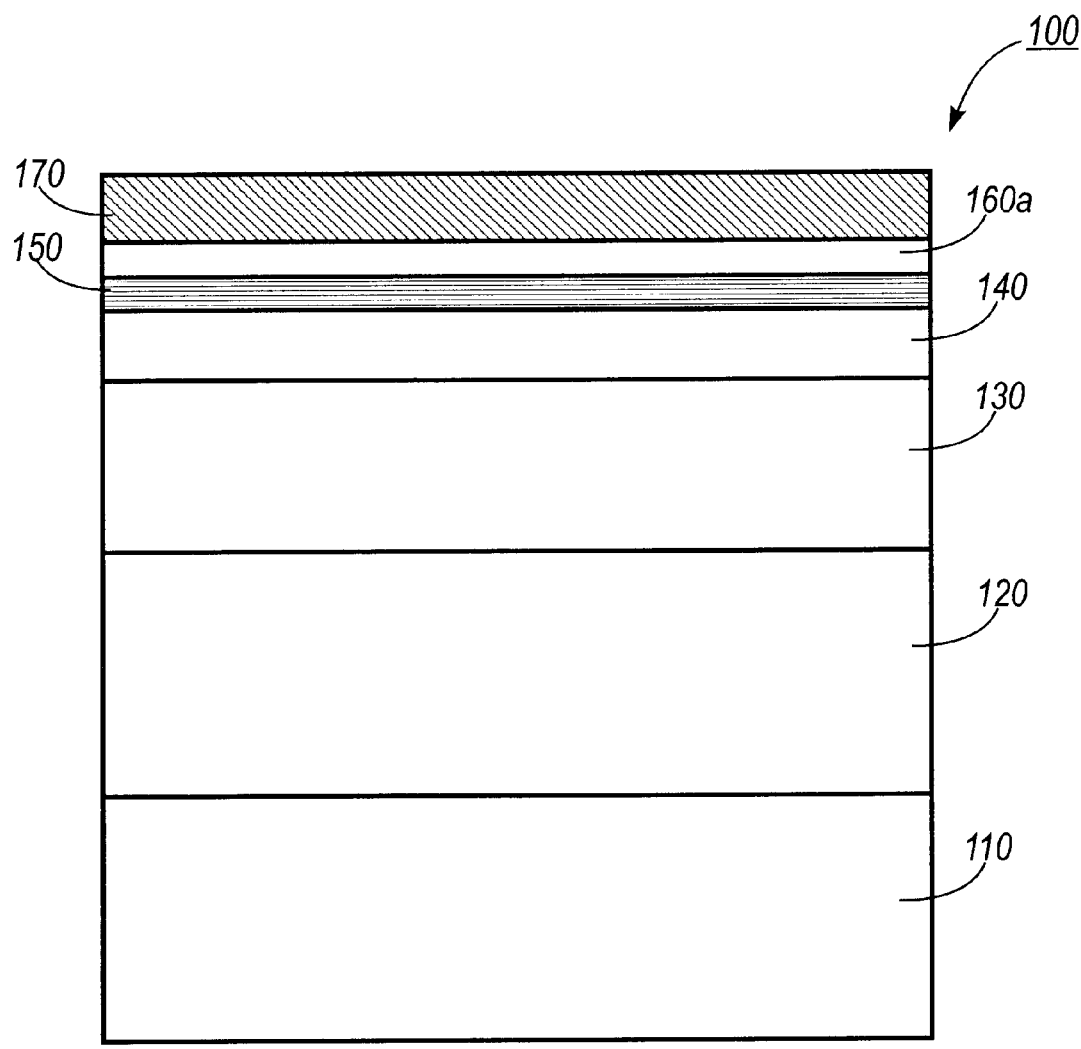
Figure 3:
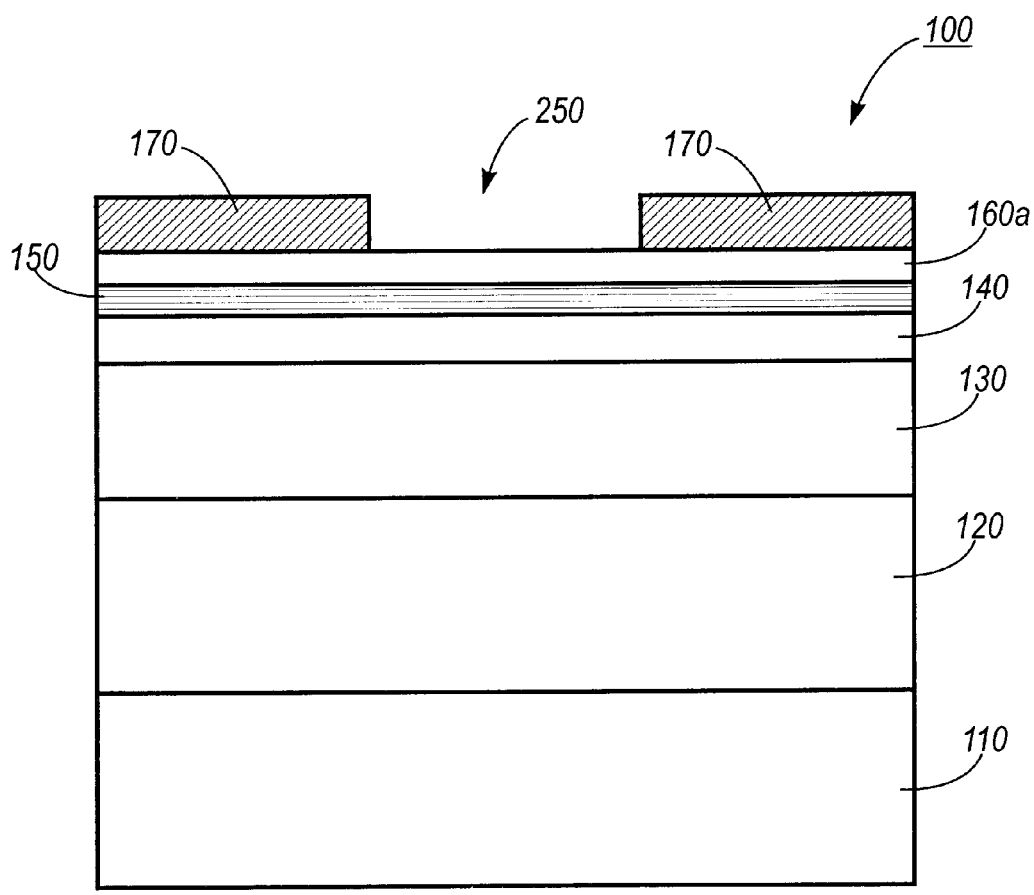

FIGS. 2–5 show the fabrication procedure for index-guided inner stripe nitride laser structure 100 in accordance with an embodiment of the invention. Standard epitaxial growth for nitride materials (see, for example, U.S. Pat. No. 6,430,202 by Van de Walle et al. incorporated by reference in its entirety) is performed on $Al_2O_3$ substrate 110 to grow GaN:Si layer 120, AlGaN:Si cladding layer 130, GaN:Si waveguide 140, InGaN multiple quantum well region 150, lower portion 160a, typically 50 nm thick but may be less to create a larger index step, of GaN:Mg waveguide 160 and n-type blocking 170 since n-type semiconducting material is used for current blocking layer 170. CAIBE (chemically assisted ion beam etching) etching typically involves using an argon ion beam and a $Cl_2/BCl_3$ gas mixture to supply the reactive gas species. CAIBE etching of narrow stripe window 250 through n-type blocking layer 170 shown in FIG. 3 is performed to expose underlying GaN waveguide layer 160a after narrow stripe window 250 has been photolithographically defined. Typical widths for stripe window 250 are from about 1–5 µm. Photoresist is stripped and acid cleaning is performed on partial laser diode structure 100 as shown in FIG. 3 prior to resumption of MOCVD growth.

Figure 4A:
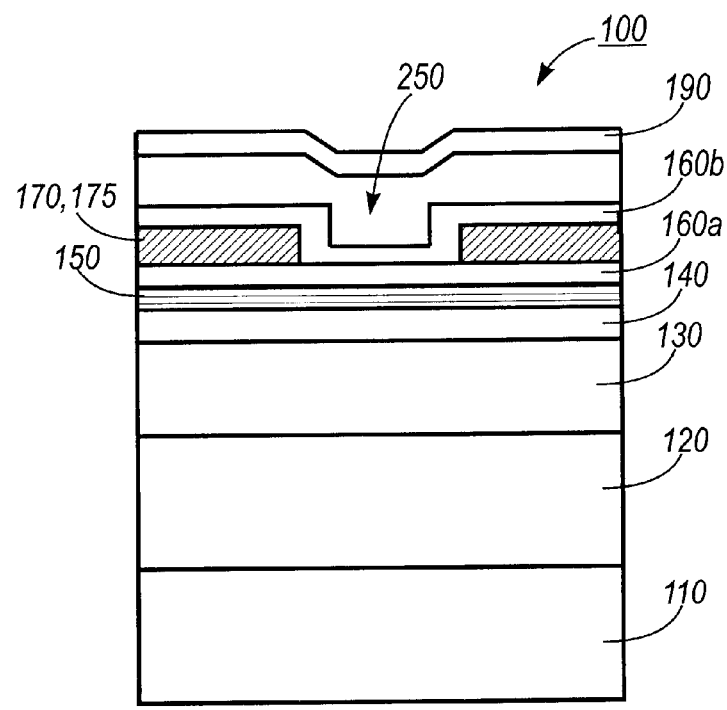

In accordance with an embodiment of the invention, FIG. 4a shows epitaxial regrowth of upper portion 160b of GaN:Mg waveguide layer 160, AlGaN:Mg p-cladding layer 180 (typically 0.5–1 µm thickness) and GaN:Mg p-contact layer 190 (typically about 0.1 µm thickness). Note that the regrowth resumes with the addition of upper portion 160b of GaN:Mg waveguide instead of proceeding directly to growth of AlGaN:Mg p-cladding layer 180 so that the thickness of GaN:Mg waveguide 160 in stripe region 250 is thicker than layer 160a. To achieve a rapid, controlled initiation of Mg p-doping, care should be taken to flow the magnesium precursor into the MOCVD growth reactor before heatup to avoid doping turn on delay due to $(C_5H_5)_2$ Mg affinity of the steel gas lines.

Epitaxial overgrowth of AlGaN blocking layer 170 may be made difficult by blocking layer 170's native oxide. Overgrowth may be facilitated by capping AlGaN current blocking layer 170 with a thin n-GaN layer (not shown) or by grading the aluminum content of AlGaN blocking layer 170 down to GaN or a lower aluminum content alloy. AlGaN current blocking layer 170 presents a tradeoff associated with the aluminum content. A high aluminum composition (typically above 20%) is desirable for optimal lateral index guiding but high aluminum alloys are more prone to cracking as AlGaN current blocking layer 170 is thickened. Hence, AlGaN current blocking layer 170 is chosen to be thinner as the aluminum content is increased. Typically, as the aluminum content of a layer is increased by about a factor of two, the layer thickness needs to be reduced by about a factor of two to prevent cracking of the layer.

Figure 4B:
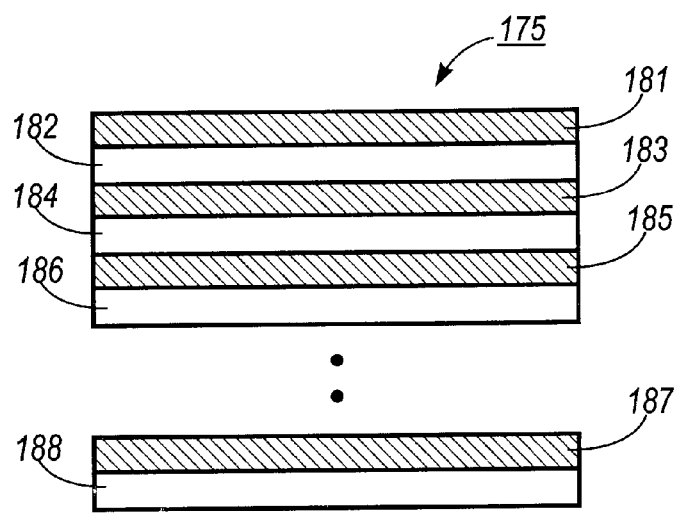
FIG. 4b shows a short period superlattice structure for use as a current blocking layer in accordance with the invention.

In accordance with an embodiment of the invention, AlGaN current blocking layer 170 may be replaced by AlGaN/GaN short period superlattice layer 175 shown in FIG. 4b having a period between 5 Å to 1000 Å, with a typical superlattice period of 50 Å (25 Å AlGaN/25 Å GaN). Growth conditions are similar to those for bulk AlGaN:Si layers. Aluminum content in AlGaN/GaN short period superlattice layer 175 may be varied in the range between 0 percent to 100 percent with a typical range between 40 percent to 100 percent with the average aluminum content in AlGaN/GaN short period superlattice 175 typically ranging from 20–50 percent.

Use of the AlGaN/GaN short period superlattice allows increased current blocking layer thickness or increased average aluminum content, typically a factor of two, before onset of layer cracking. AlGaN/GaN short period superlattice layer 175 is typically doped with silicon throughout layer 175. Alternatively, AlGaN/GaN short period superlattice layer 175 may be doped only in GaN layers 182, 184, 186 . . . 188 or AlGaN layers 181, 183, 185 . . . 187 or not doped. To maximize barrier height at the interface to GaN:Mg layer 160b, short period superlattice 175 is typically capped with AlGaN:Si layer 181. The thickness of short period superlattice 175 can be non-destructively and very accurately measured by x-ray diffraction. Precise knowledge of current blocking layer 175 is important for the chemically assisted ion beam etch (CAIBE) step defining window 250 in current blocking layer 175 to avoid etching through GaN:Mg layer 160a into multiple quantum well region 150.

If AlN is chosen for current blocking layer 170, deposition of an amorphous or polycrystalline film by sputtering may be preferable to epitaxial growth. This retains a low refractive index for current blocking layer 170 while avoiding lattice strain that leads to cracking. Care should be taken to avoid poor structural quality that contributes to large scattering and absorption losses.

Figure 5:
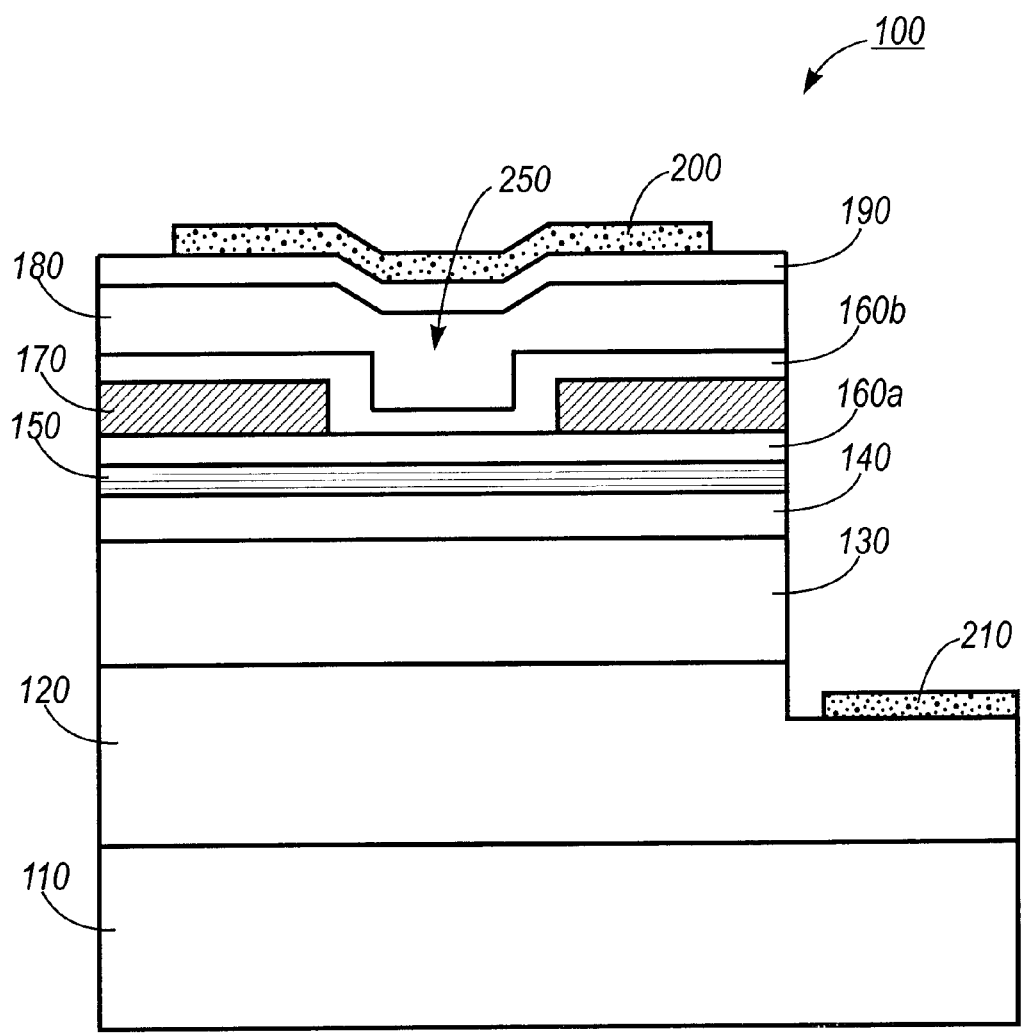
FIG. 5 shows a laser diode structure in accordance with the invention.

In accordance with an embodiment of the invention, FIG. 5 shows metallization for p-contact 200 and n-contact 210. Palladium p-metal for p-contact 200 is alloyed at about 535° C. for about 5 minutes in an $N_2$ ambient. The first mirror is photolithographically defined and etched using CAIBE. The deposited palladium p-metal layer is first chemically etched. CAIBE etching is performed to a depth of about 2 μm to penetrate into GaN:Si layer 120 under AlGaN:Si cladding layer 130. Hence, the CAIBE etching exposes the area for n-contact 210. The second mirror is similarly etched. Liftoff metallization, typically Ti—Al, is performed for n-contact 210. Subsequently, Ti—Au metallization builds up metal thickness on p-contact 200 and n-contact 210. The first and second mirrors are coated with $SiO_2/TiO_2$ using an evaporative process.

Figure 6:
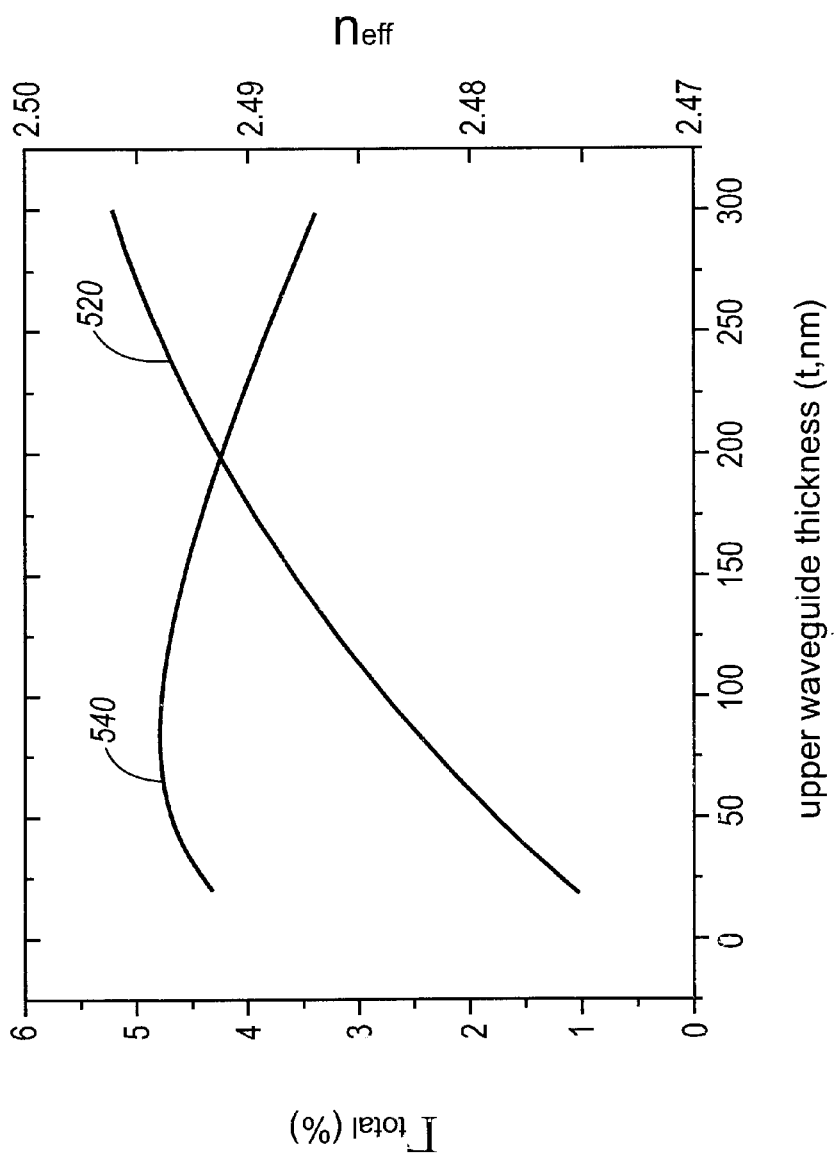
FIG. 6 shows the calculated tranverse effective index and optical confinement factor for an index guided inner strip nitride laser diode structure in accordance with the invention.

FIG. 6 shows effective transverse refractive index curve and optical confinement factor with curve 520 and curve 540, respectively, as a function of the thickness, t, of GaN:Mg waveguide 160 for an embodiment of nitride laser diode structure 100 in accordance with the present invention. $Al_{0.07}Ga_{0.93}N$ cladding layers 180 and 130 have a refractive index of 2.46 at 400 nm wavelength, 100 nm GaN waveguide 140 has a refractive index of 2.51 and multiple quantum well active region 150 has four 35 Å $In_{0.15}Ga_{0.85}N$ quantum wells with a refractive index of 2.56 that are separated by 65 Å $In_{0.03}Ga_{0.97}N$ barriers with a refractive index of 2.52. From the calculated transverse effective indices, a lateral index profile may be obtained for index-guided inner stripe nitride laser structure 100.

N-blocking layer 170 is formed of $Al_{0.07}Ga_{0.93}N$ which is the same alloy used in cladding layers 180 and 130. Higher aluminum content blocking layers may be used to produce larger index steps if cracking or overgrowth problems are avoided or short period superlattice 175 may be used instead. For the case where n-blocking layer 170 is grown 50nm above multiple quantum well active region 150, 100 nm of GaN:Mg is deposited after photolithographically defining narrow stripe window stripe 250 to complete waveguide layer 160 followed by a typical $Al_{0.07}Ga_{0.93}N$ cladding layer having a thickness from about 0.4–0.5 μm and GaN:Mg capping layer 190. With reference also to FIG. 5, complete GaN waveguide 160 is about 100 nm thicker in the stripe region of waveguide layer 160 in comparison to the thickness of partial waveguide layer 160a. The resulting transverse effective refractive indices are shown in table 1 below:

| Region | GaN:Mg waveguide 160 thickness | transverse effective refractive index |
|---|---|---|
| stripe region of layer 160 | 150 nm | 2.488 |
| partial waveguide layer 160a | 50 nm | 2.479 |
| | | Δn = 0.009 |

The transverse effective refractive index step, Δn, of 0.009 is greater than the refractive index step achieved in a conventional nitride ridge waveguide laser structure while allowing much easier fabrication of a narrow stripe structure. Furthermore, the optical confinement factor is not compromised since waveguide 160 thickness of 150 nm in the stripe region of layer 160 produces an optical confinement factor that is very nearly maximized (see FIG. 6).

In accordance with an embodiment of the invention, current blocking layers may also be formed from lower refractive index insulating materials such as SiON, $Si_3N_4$, or $SiO_2$ to provide a larger refractive index step and greater lateral index waveguiding. For example, referring to index-guided inner stripe nitride laser structure 600 in FIG. 7, using $SiO_2$ with a refractive index of 1.50 for current blocking layer 670 significantly increases the lateral refractive index step in comparison to $Al_{0.07}Ga_{0.93}N$ blocking layer 170 placed a comparable distance from multiple quantum well active region 150. Current blocking layer 670 is deposited after the first epitaxy in contrast to current blocking layer 170 in FIG. 3 which is deposited during the first epitaxy. Insulating current blocking layer 670 may be deposited by sputtering, evaporation or high temperature CVD process. Narrow stripe window 650 is photolithographically defined followed by CAIBE or plasma etching with $CF_4/O_2$ into, but not through, waveguide layer 660a.

The transverse effective refractive indices for $SiO_2$ blocking layer 670 are summarized in table 2 below:

| Region | GaN:Mg waveguide 660 thickness | transverse effective refractive index |
|---|---|---|
| stripe region of layer 660 | 150 nm | 2.480 |
| partial waveguide layer 660a | 50 nm | 2.460 |
| | | Δn = 0.020 |

Figure 7:
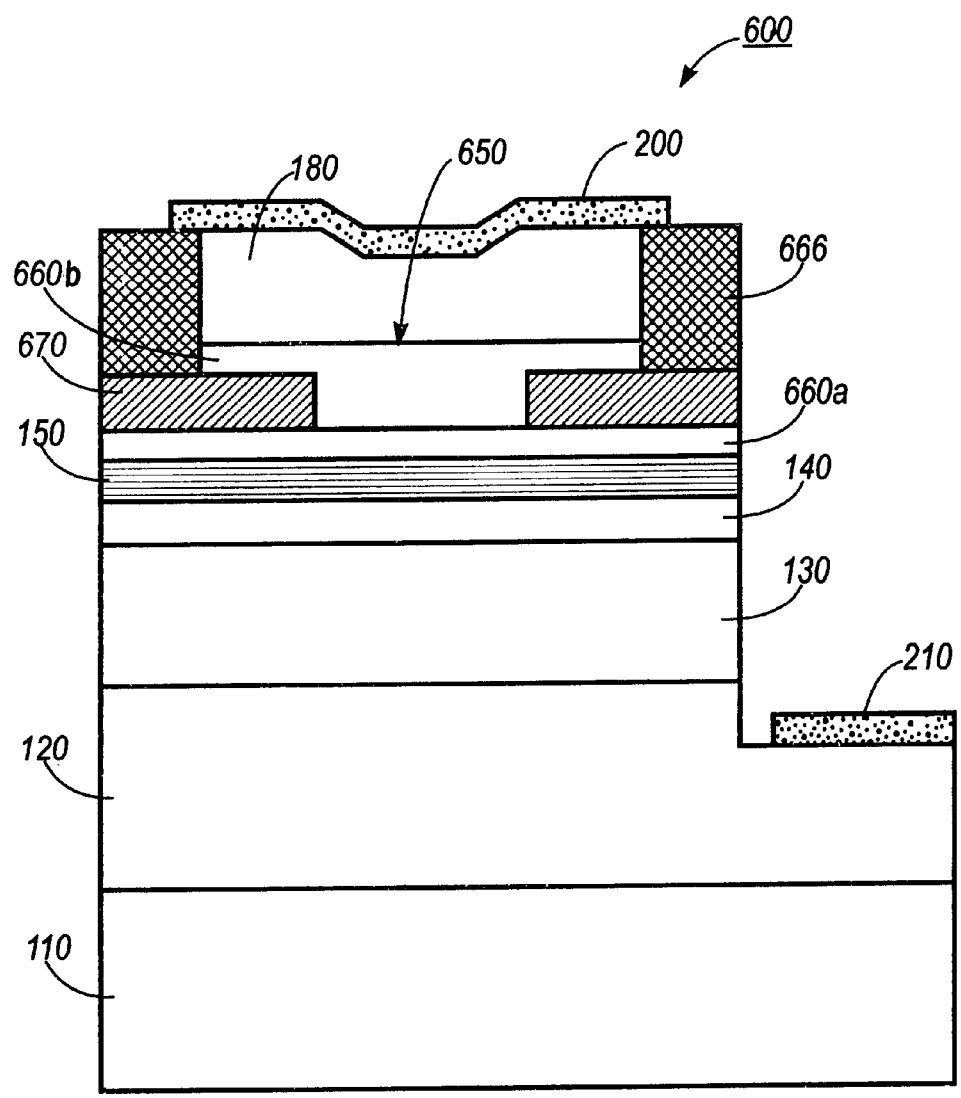
FIG. 7 shows an index guided inner strip nitride laser diode structure with insulating current blocking layers in accordance with an embodiment of the invention.
Figure 8:
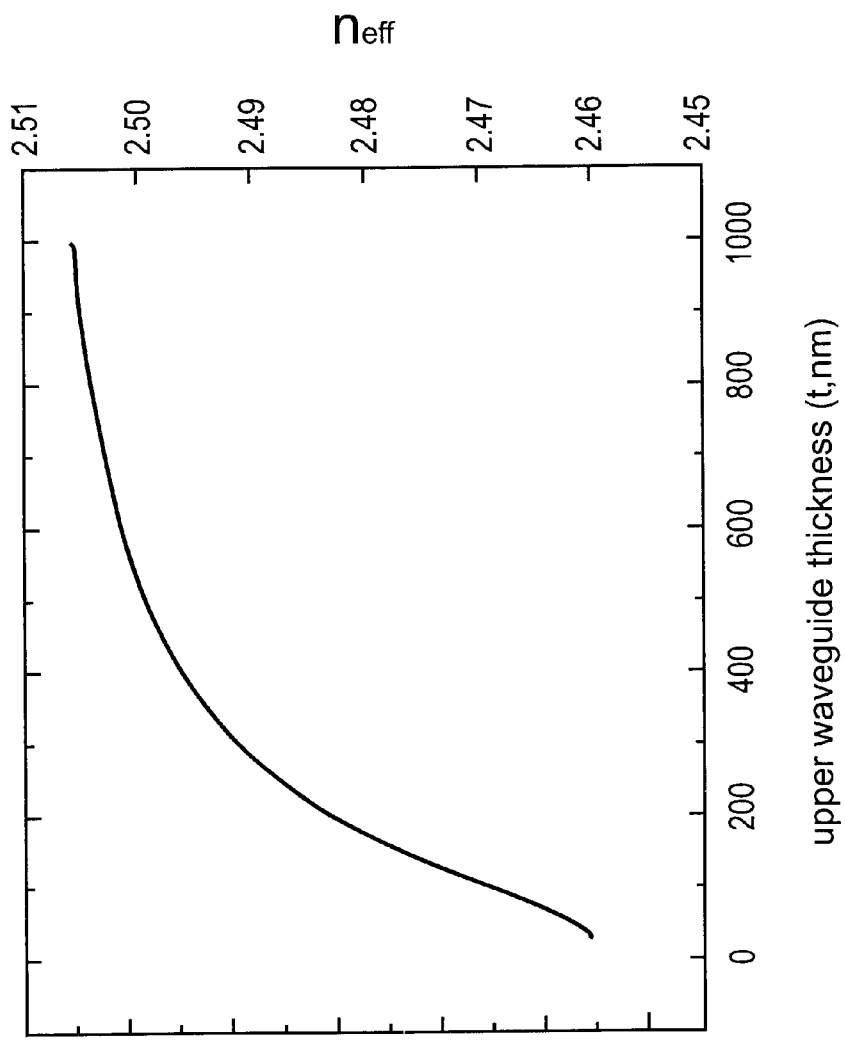
FIG. 8 shows the calculated tranverse effective index for an index guided inner strip nitride laser diode structure with $SiO_2$ current blocking layer in accordance with an embodiment of the invention.

The values plotted in FIG. 8 correspond to index-guided, inner stripe nitride laser structure 600 in FIG. 7. In index-guided, inner stripe nitride laser structure 600, waveguide layer 660 is epitaxially laterally grown over $SiO_2$ current blocking layer 670 followed by deposition of $Al_{0.07}Ga_{0.93}N$ cladding layer 180. Inner stripe 650 is opened in current blocking layer 670 to allow for current flow to multiple quantum well active region 150. Waveguide layer 660 is made up of layers 660a and 660b. However, waveguide layer 660b typically only partially laterally overgrows current blocking layer 670 before the desired thickness for waveguide layer 660b is achieved resulting in part of current blocking layer 670 being uncovered prior to growth of AlGaN cladding layer 180. Hence, instead of epitaxial overgrowth, polycrystalline AlGaN regions 666 form over the exposed portion of current blocking layers 670 whereas epitaxial overgrowth occurs on waveguide layer 660b.

If $SiO_2$ blocking layer 670 is placed closer than 50 nm to multiple quantum well active region 150 the lateral index step would be increased. The value of 50 nm for the separation of blocking layer 670 from multiple quantum well active region 150 is conservatively selected and less separation is possible.

However, $SiO_2$ may not have sufficient thermal stability to function as current blocking layer 670 if the $SiO_2$ is exposed to high temperature MOCVD process conditions. $SiO_2$ at high MOCVD temperatures may act as a source of oxygen or silicon donors which are n-type and this could make p-type doping difficult and result in degraded performance of the inner stripe laser diode. High quality (dense, perfectly stoichiometric) $Si_3N_4$ may be deposited at high temperatures by CVD which indicates excellent thermal stability. Hence, if high temperature processing is involved, $Si_3N_4$ is an alternative dielectric material for current blocking layer 670 even though its refractive index is higher producing a smaller transverse refractive index step, $\Delta n$.

Figure 9:
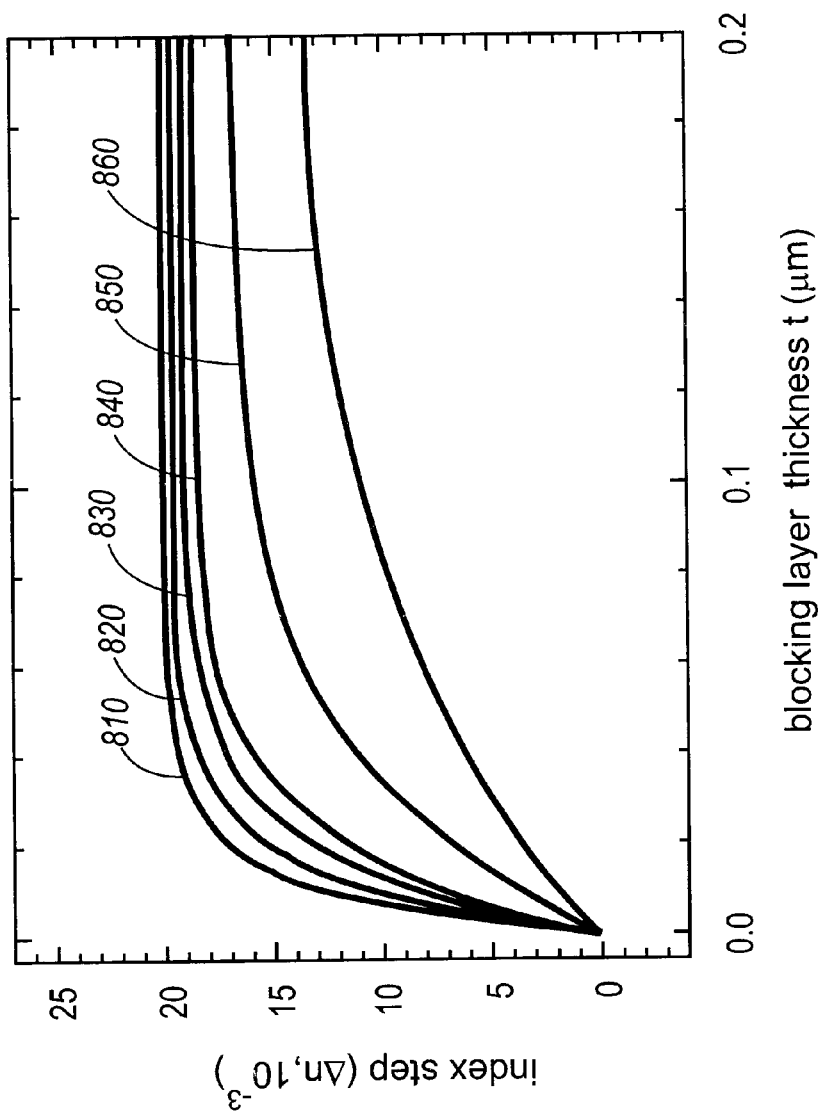
FIG. 9 shows the relationship between blocking layer thickness and lateral index step for embodiments in accordance with the invention.

FIG. 9 shows simulated lateral index step, $\Delta n$, as a function of current blocking layer 170 or 670 thickness assuming current blocking layer 170 or 670 is positioned 50 nm from multiple quantum well region 150. Curve 810 shows lateral index step $\Delta n$ as a function of $SiO_2$ current blocking layer 670 thickness assuming a typical $SiO_2$ refractive index of 1.5. Curve 820 shows lateral index step $\Delta n$ as a function of SiON current blocking layer 670 thickness assuming a typical SiON refractive index of 1.8. Curve 830 shows lateral index step $\Delta n$ as a function of $Si_3N_4$ current blocking layer 670 thickness assuming a typical $Si_3N_4$ refractive index of 2.0. Curve 840 shows lateral index step $\Delta n$ as a function of AlN current blocking layer 170 thickness assuming a typical AlN refractive index of 2.1. Curve 850 shows lateral index step $\Delta n$ as a function of $Al_{0.5}Ga_{0.5}N$ current blocking layer 170 thickness assuming a typical $Al_{0.5}Ga_{0.5}N$ refractive index of 2.3. Curve 860 shows lateral index step $\Delta n$ as a function of $Al_{0.2}Ga_{0.8}N$ current blocking layer 170 thickness assuming a typical $Al_{0.2}Ga_{0.8}N$ refractive index of 2.4. Note that the index step for curves 810–840 plateaus for blocking layer thicknesses below about 0.08 $\mu$m while the index step for curve 850 requires a thickness of about 0.1 $\mu$m before achieving a plateau and the index step for curve 860 increases with increasing thickness beyond a 0.1 $\mu$m thickness.

Figure 10:
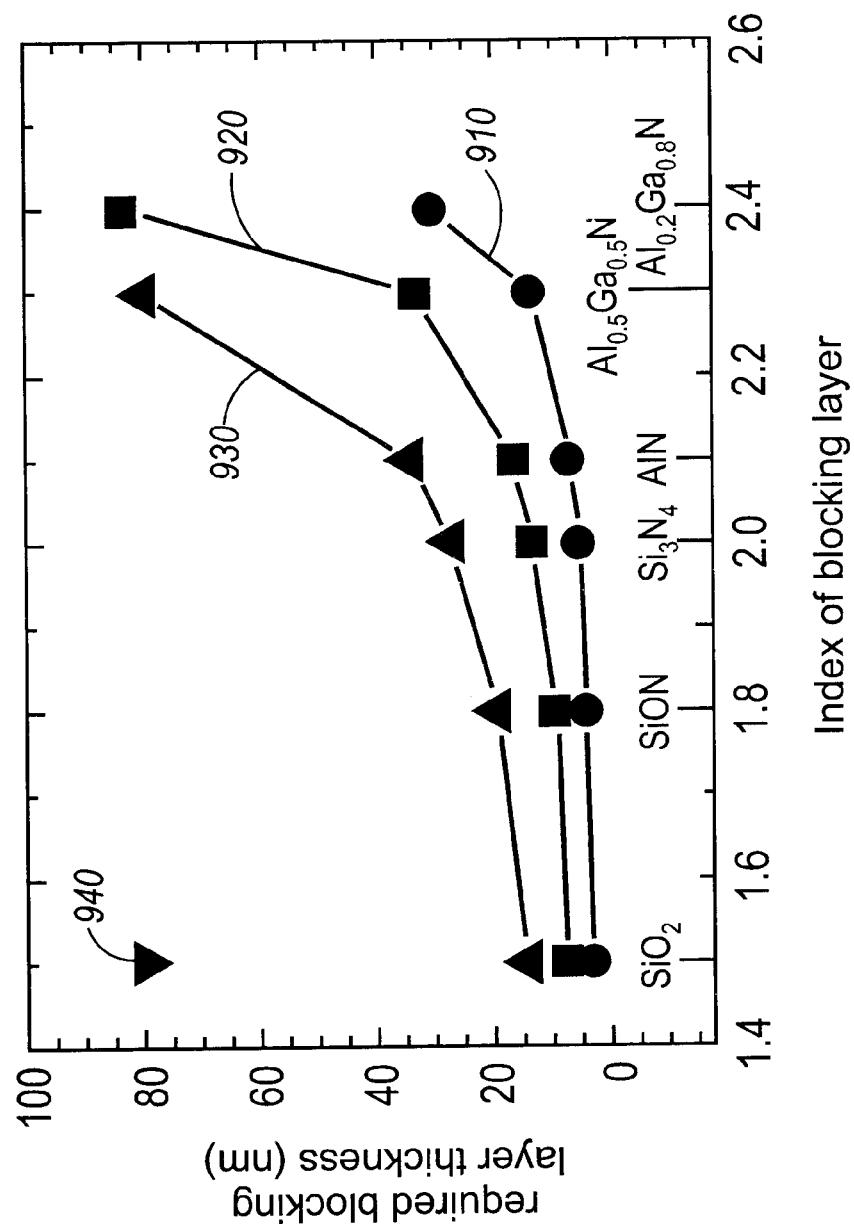
FIG. 10 shows the layer thickness required for a current blocking layer of a given refractive index to obtain a specific lateral index step in accordance with an embodiment of the invention.

FIG. 10 shows the layer thickness required for current blocking layer 170 or 670 of a given refractive index to obtain lateral index step 910 of $5 \times 10^{-3}$, lateral index step 920 of $10 \times 10^{-3}$, lateral index step 930 of $15 \times 10^{-3}$ and lateral index step 940 of $20 \times 10^{-3}$. If short period superlattice structure 175 is used for current blocking, the thickness will be the same as for current blocking layer 170 for the same aluminum content. The refractive indices of several representative materials ($SiO_2$, SiON, $Si_3N_4$, AlN, $Al_{0.5}Ga_{0.5}N$ and $Al_{0.2}Ga_{0.8}N$) are denoted on the axis. It is apparent from FIG. 10 that as the refractive index of the material used for blocking layer 170 or 670 increases, the thickness of blocking layer 170 or 670 must be increased to maintain the same lateral index step. For lateral index step 940 of $20 \times 10^{-3}$, the thickness of blocking layer 170 or 670 is required to be thicker than 100 nm for representative materials other than $SiO_2$.

Figure 11:
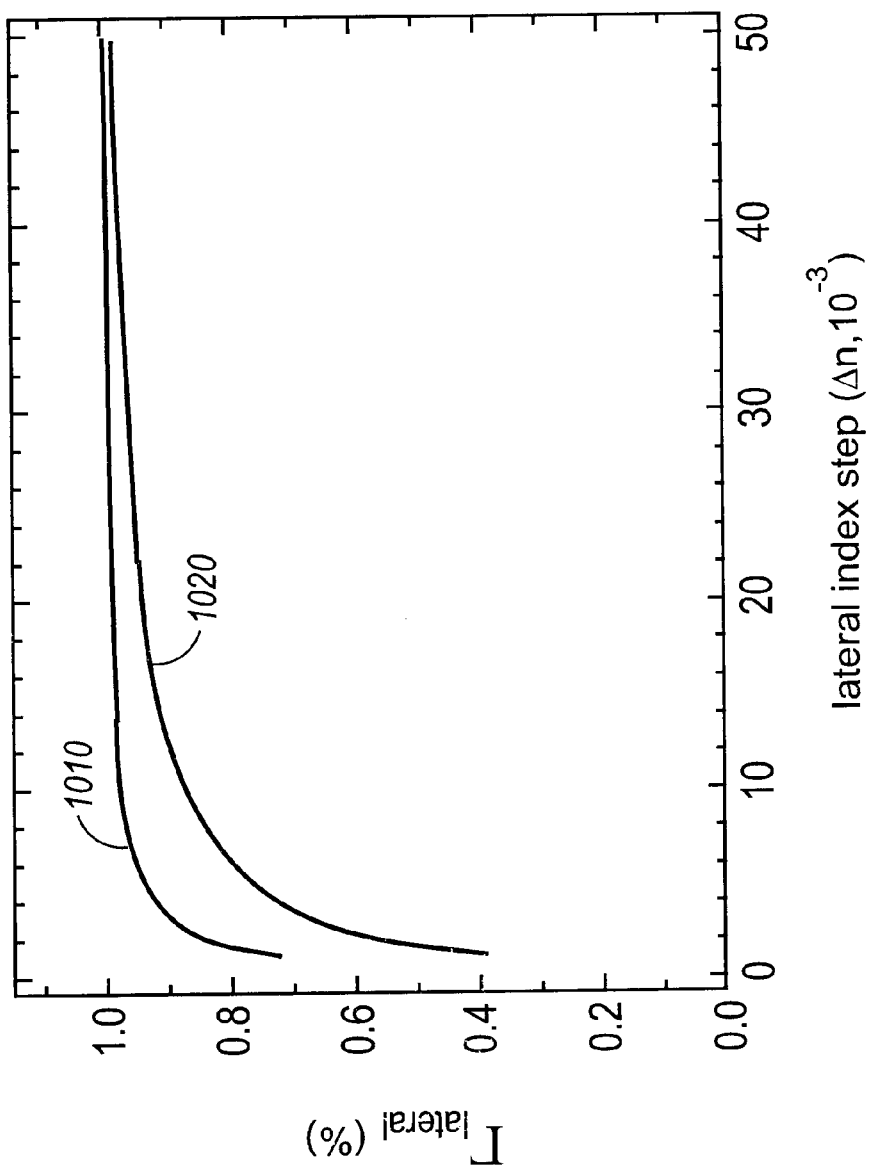
FIG. 11 shows the lateral optical confinement factor for 1 µm and 2 µm wide lasers as a function of lateral index step.

FIG. 11 shows the lateral confinement factor in percent, $\Gamma_{lateral}$, versus the lateral index step for a 2 $\mu$m wide stripe laser plotted as curve 1010 and a 1 $\mu$m wide stripe laser plotted as curve 1020. FIG. 11 shows that improvement of the lateral confinement factor, $\Gamma_{lateral}$, is marginal for a 2 $\mu$m wide stripe laser with a lateral index step greater than about $10 \times 10^{-3}$ and for a 1 $\mu$m wide stripe laser with a lateral index step greater than about $20 \times 10^{-3}$.

Figure 12:
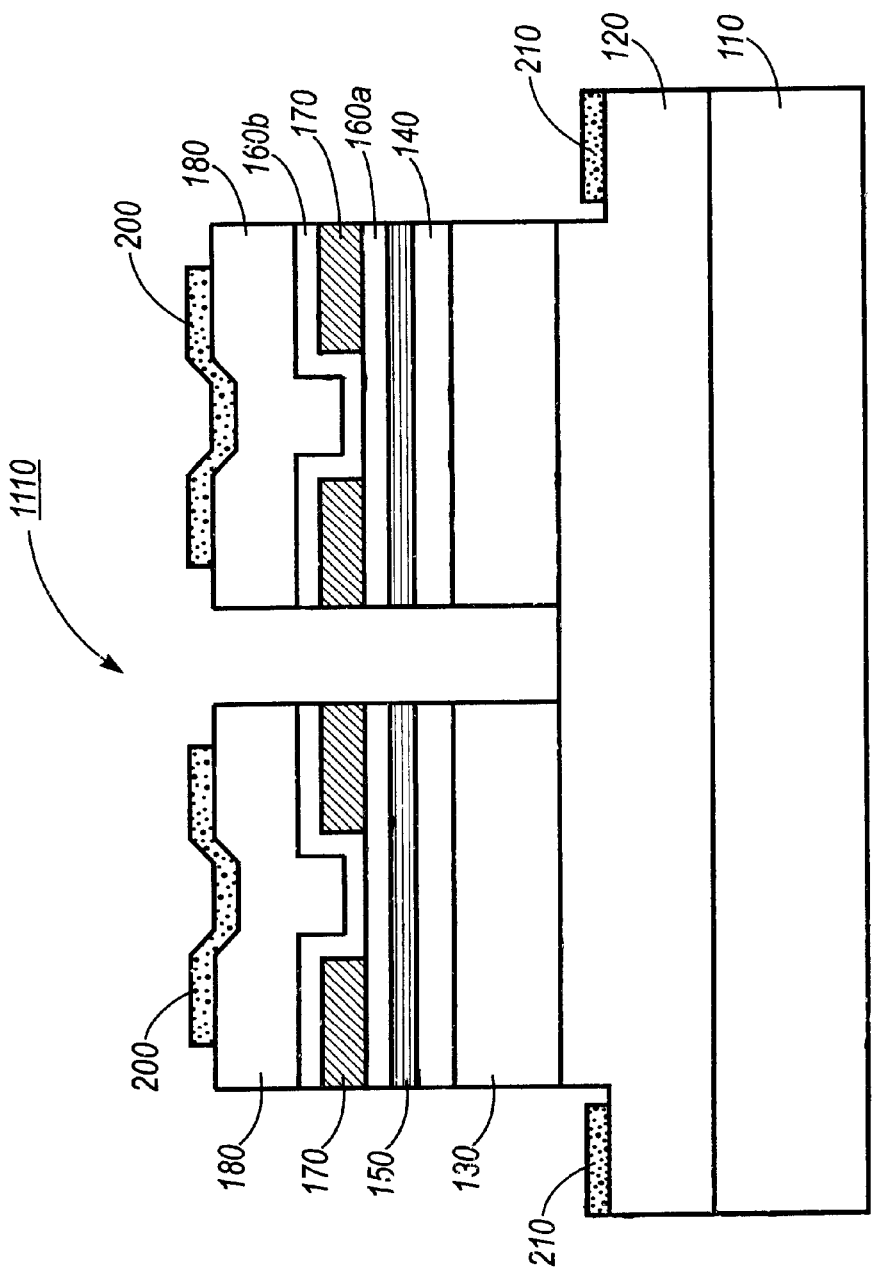
FIG. 12 shows a dual-spot inner stripe laser structure using a semiconductor current blocking layer in accordance with an embodiment of the invention.
Figure 13:
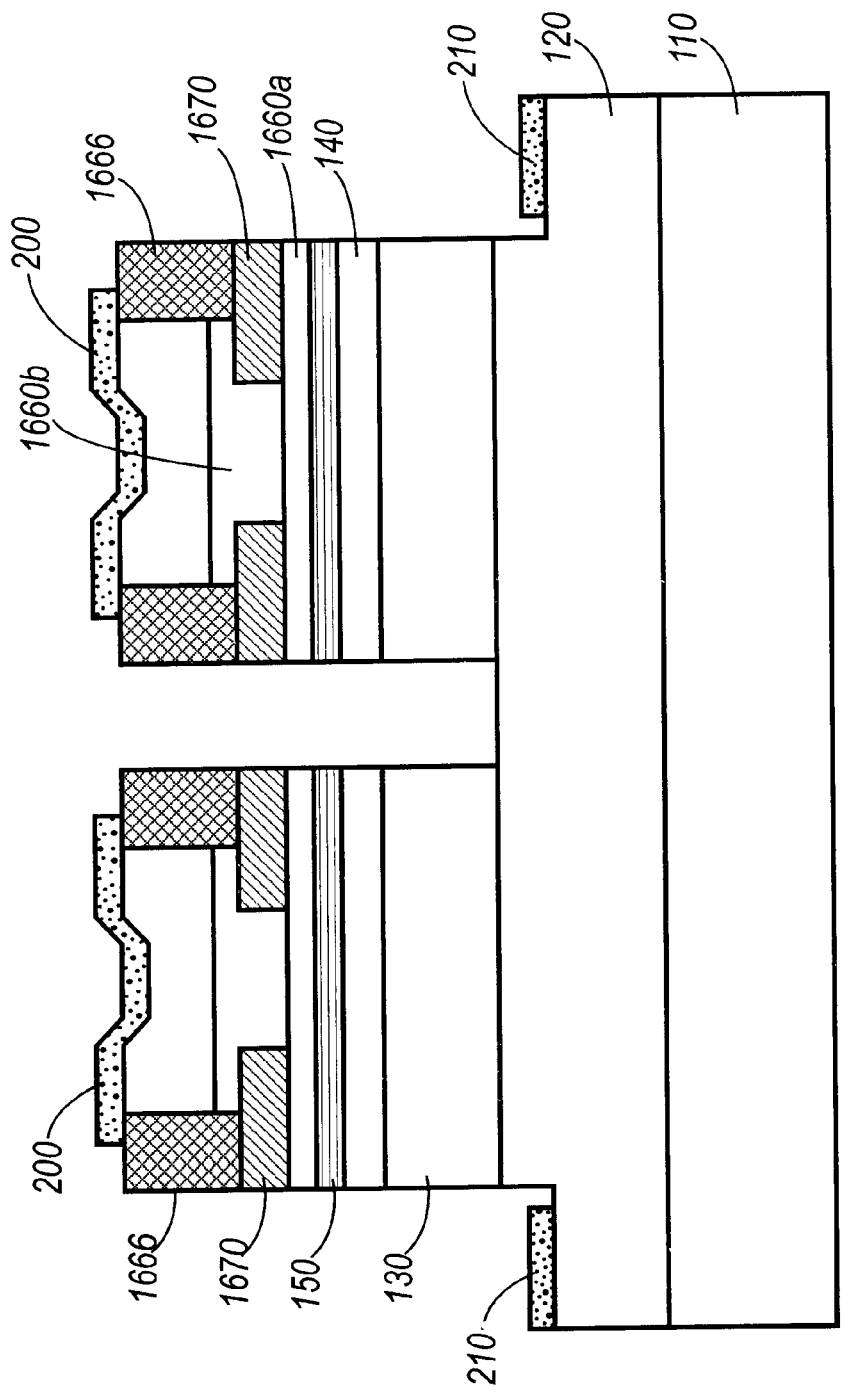
FIG. 13 shows a dual-spot inner stripe laser structure using an insulating current blocking layer in accordance with an embodiment of the invention.

FIG. 12 shows dual spot, inner-stripe nitride laser diode structure 1100 using semiconductor current blocking layers 170. Quadspot lasers or other multispot configurations are also realizable using the inner-stripe structure disclosed. The two lasers making up dual spot, inner-stripe laser diode 1110 individually have essentially the same layer structure as laser 100 shown in FIG. 5. Semiconductor growth over AlGaN current blocking layers 170 is epitaxial and conformal. In comparison, FIG. 13 shows dual spot, inner-stripe nitride laser diode structure 1200 using current blocking layer 1670 made of insulating material such as, for example, $SiO_2$, SiON or $Si_3N_4$. Current blocking layers 1670 have partial lateral overgrowth by waveguide layer 1660$b$ that occurs during regrowth. However, waveguide layer 1660$b$ typically only partially laterally overgrows current blocking layer 1670 before the desired thickness for layer 1660$b$ is achieved resulting in part of current blocking layer 1670 being uncovered prior to growth of AlGaN cladding layer 1180. Hence, instead of epitaxial overgrowth, polycrystalline AlGaN regions 1666 form over the exposed portion of current blocking layers 1670 whereas epitaxial overgrowth occurs on waveguide layer 1660$b$. Note that overgrowth in the vicinity of the stripe is epitaxial.

Figure 14:
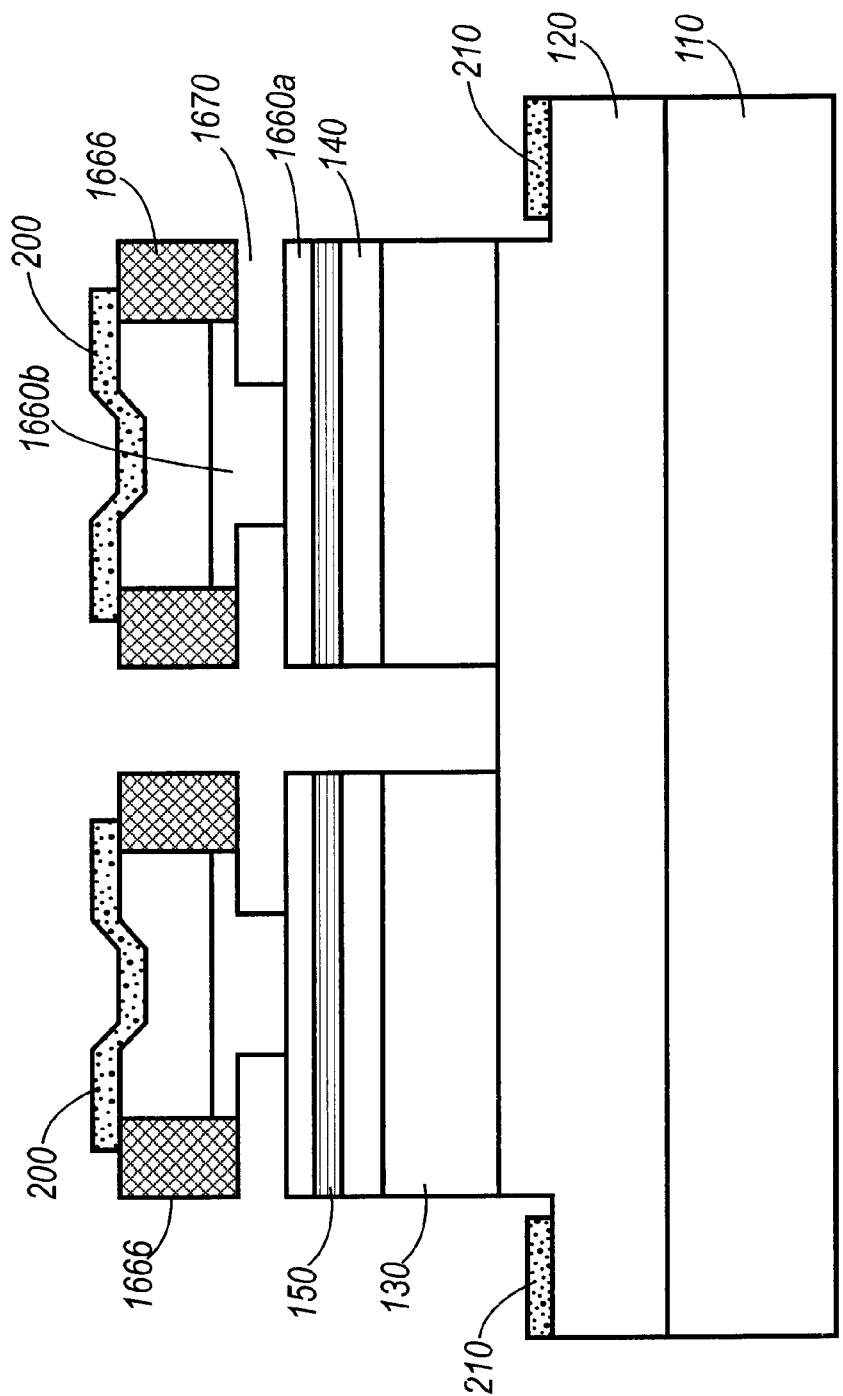
FIG. 14 shows a dual-spot inner stripe laser structure using an air gap current blocking layers in accordance with an embodiment of the invention.

Air having a refractive index of about 1 is an alternative material for current blocking layers 670 and 1670. FIG. 14 shows dual spot, inner-stripe nitride laser diode structure 1200 in accordance with the invention having air as the current blocking material. $SiO_2$, SiON or other selectively etchable material is used for current blocking layers 670 and 1670. Following fabrication of inner-stripe nitride laser diode structure 600 or dual spot, inner-stripe nitride laser diode structure 1200, the respective structure is treated with hydrofluoric acid, for example, to etch away the selectively etchable material by undercutting from the exposed sidewalls and leaving air gaps in to function as current blocking layer 670 or 1670.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. An inner-stripe nitride laser diode structure comprising:
    a multiple quantum well layer comprising nitride;
    a wave guide layer having a first and second surface, said first surface of said wave guide layer contacting said multiple quantum well layer;
    a current blocking layer penetrating into said second surface of said wave guide layer, said current blocking layer comprising a short period superlattice; and a cladding layer formed over the wave guide layer such that a portion of the wave guide layer is located between the cladding layer and the current blocking layer.

2. The structure of claim 1 wherein said short period superlattice is silicon doped.

3. The structure of claim 1 wherein said short period superlattice has a period of approximately 50 angstroms.

4. The structure of claim 1 wherein said short period superlattice is comprised of AlGaN/GaN.

5. The structure of claim 1 wherein said short period superlattice has an average aluminum percent composition selected from the range of 20 percent to 50 percent.

6. The structure of claim 1 wherein a thickness of a first part of the wave guide layer located in the stripe region between the two parts of the blocking layer is greater than a thickness of a second part of the wave guide layer located between one part of the current blocking layer and the multiple quantum well layer.

7. A method for making an inner-stripe nitride laser diode structure comprising:

provide a multiple quantum well layer comprising nitride;

providing a wave guide layer having a first and second surface, said first surface of said wave guide layer contacting said multiple quantum well layer, wherein providing the wave guide layer includes growing a first portion of the wave guide layer;

providing a current blocking layer penetrating into said second surface of said wave guide layer, said current blocking layer comprising a short period superlattice, wherein providing the current blocking layer includes forming the two parts of said current blocking layer, and then regrowing a second portion of the wave guide layer; and growing a cladding layer on the second portion of the wave guide layer.

8. The method of claim 7 wherein said short period superlattice is silicon doped.

9. The method of claim 7 wherein said short period superlattice has a period of approximately 50 angstroms.

10. The method of claim 7 wherein said short period superlattice is comprised of AlGa/GaN.

11. The method of claim 7 wherein said short period superlattice has an average aluminum percent composition selected from the range extending from approximately 20 percent to 50 percent.

* * * * *